United States Patent [19]

Uetani et al.

[11] Patent Number: 5,407,778
[45] Date of Patent: Apr. 18, 1995

[54] POSITIVE RESIST COMPOSITION

[75] Inventors: Yasunori Uetani, Toyonaka; Jun Tomioka, Takarazuka; Hirotoshi Nakanishi, Osaka, all of Japan

[73] Assignee: Sumitomo Chemical Company, Limited, Osaka, Japan

[21] Appl. No.: 60,539

[22] Filed: May 13, 1993

[30] Foreign Application Priority Data

May 18, 1992 [JP] Japan .................. 4-124536

[51] Int. Cl.6 .................. G03F 7/023; G03F 7/30
[52] U.S. Cl. .................. 430/192; 430/165; 430/191; 430/193
[58] Field of Search .................. 430/191, 192, 193, 165

[56] References Cited

U.S. PATENT DOCUMENTS

| 4,529,682 | 7/1985 | Toukhy | 430/190 |
| 4,536,465 | 8/1985 | Uehara et al. | 430/190 |
| 4,681,923 | 7/1987 | Demmer et al. | 430/191 |
| 4,957,846 | 9/1990 | Jeffries, III et al. | 430/190 |
| 5,173,389 | 12/1992 | Uenishi et al. | 430/192 |
| 5,178,986 | 1/1993 | Zampini et al. | 430/192 |

FOREIGN PATENT DOCUMENTS

| 0363978 | 10/1989 | European Pat. Off. |
| 62-10646 | 1/1987 | Japan . |
| 2296249 | 1/1990 | Japan . |
| 2285351 | 11/1990 | Japan . |

OTHER PUBLICATIONS

SPIE vol. 1086 Advances in Resist Technology and Processing VI (1989) pp. 363–373.

Primary Examiner—Charles L. Bowers, Jr.
Assistant Examiner—John S. Chu
Attorney, Agent, or Firm—Birch, Stewart, Kolasch & Birch

[57] ABSTRACT

A positive resist composition comprising an alkali-soluble resin and a light-sensitive quinonediazide material containing a quinonediazidesulfonic acid diester of at least one member selected from the phenol compounds represented by the following general formulas:

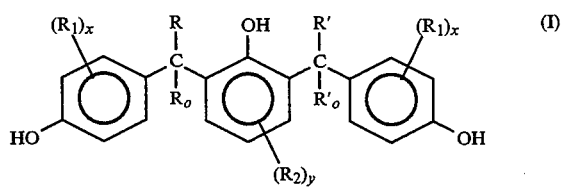

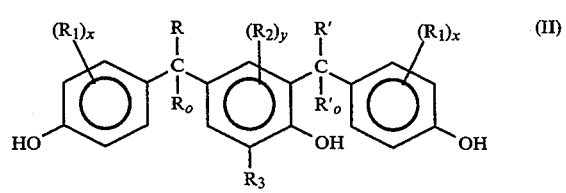

wherein $R_1$ and $R_2$ each represent hydrogen, halogen, $-OCOR_3$, alkyl or alkoxy in which $R_3$ represents alkyl or phenyl, x and y each represent 1, 2 or 3, and R, $R_o$, R' and $R_o'$ each represent hydrogen atom, alkyl or phenyl group; wherein the content of said diester is 50% or greater based on the total light-sensitive quinonediazide material. This composition is excellent in the balance between properties such as resolution, profile and depth of focus.

11 Claims, No Drawings

POSITIVE RESIST COMPOSITION

BACKGROUND OF THE INVENTION

1. Field of the Invention

This invention relates to a positive resist composition which responds to radiations such as ultraviolet ray, far ultraviolet rays including excimer laser and the like, electron beam, ion beam, X ray and the like.

2. Related Art

Recently, with a rise in the integration level of integrated circuits, formation of patterns of sub-micron order is required, and it is desired to provide a positive resist composition which is excellent in various properties such as a profile, a depth of focus and resolution. In particular, for the production of 16–64M DRAMs, it is required to resolve a pattern having a line width of 0.5 μm or less with a good profile and a broad depth of focus.

In SPIE Vol. 1086, Advances in Resist Technology and Processing VI- (1989)/Pages 363–373, there are mentioned positive resist compositions comprising a cresol/formaldehyde novolak resin and a triester obtained through a condensation reaction of naphtho-quinone-2-diazide-5-sulfonic acid with each of 2,3,4-trihydroxybenzophenone, 2,6-bis[(2-hydroxy-3,5-dimethylphenyl)methyl]-4-methylphenol and 2,6-bis[(4-hydroxy-3,5-dimethylphenyl)methyl]-4-methylphenol.

In Japanese Patent Application KOKAI No. 2-285351 (corresponds to U.S. Pat. No. 5,173,389), there is mentioned a positive photoresist composition comprising an alkali-soluble novolak resin and a photosensitive material obtained by reacting a polyhydroxy compound having at least one group represented by the following formula:

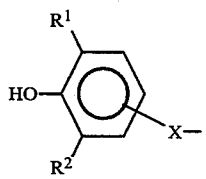

wherein $R^1$ and $R^2$ each represent hydrogen or a straight chain or branched chain alkyl or alkoxy group having 1–4 carbon atoms, provided that $R^1$ and $R^2$ cannot simultaneously be hydrogen, and X represents a divalent organic group, with 1,2-naphthoquinone-5- (and/or -4-) sulfonyl chloride. Further, in Japanese Patent Application KOKAI No. 2-296249, there is mentioned a positive resist composition comprising an alkali-soluble phenolic resin and a photosensitive material containing a quinonediazide sulfonate of a compound represented by the following formula:

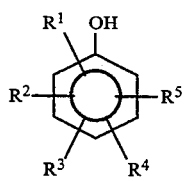

wherein $R^1$ to $R^5$ each represent hydrogen, halogen, alkyl, alkenyl or alkoxy group having 1–4 carbon atoms or hydroxy group, provided that at least one of $R^1$ to $R^5$ is a group of the following formula:

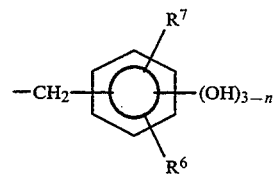

wherein $R^6$ and $R^7$ each represent halogen, alkyl group or alkenyl group and n is a number of 0, 1 or 2. Further, in Japanese Patent Application KOKAI No. 62-10646, there is mentioned a positive photoresist composition comprising an alkali-soluble phenolic resin and a photosensitive material containing a condensation product of a phenol compound represented by the following formula:

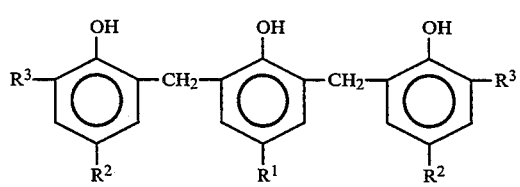

wherein $R^1$ to $R^3$ each represent hydrogen or lower alkyl group, with o-quinonediazidesulfonyl chloride.

None of these compositions, however, have been able to resolve a pattern having a line width of 0.5 μm or less with a broad depth of focus and a good profile.

SUMMARY OF THE INVENTION

An object of the present invention is to provide a positive resist composition which is excellent in the balance between properties such as resolution, profile, depth of focus, etc.

According to the present invention, there is provided a positive resist composition comprising an alkali-soluble resin and a light-sensitive quinonediazide material containing a quinonediazidesulfonic acid diester of at least one phenol compound represented by the following general formulas (I) or (II):

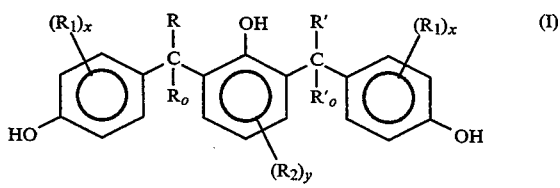

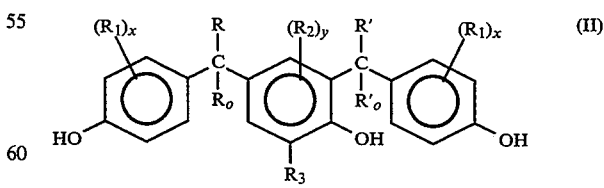

wherein $R_1$ and $R_2$ independently of one another each represent hydrogen atom, halogen atom, —OCOR$_3$ or optionally substituted alkyl or alkoxy group in which $R_3$ represents optionally substituted alkyl or phenyl group, x and y independently of one another each represent an integer of 1, 2 or 3, and R, R$_o$, R' and R$_o$ independently of one another each represent hydrogen atom, alkyl group or phenyl group, and the ratio of the pattern area of said quinonediazidesulfonic acid diester to the total pattern area of the light-sensitive quinonediazide material as measured by high speed liquid chromatography being 0.5/1 or greater.

DESCRIPTION OF THE INVENTION

As preferable examples of the optionally substituted alkyl group represented by $R_1$ to $R_3$ and the optionally substituted alkoxy group represented by $R_1$ to $R_2$, those of straight or branched chain form having 1–4 carbon atoms can be referred to. Preferable examples of the alkyl group represented by R, $R_o$, R' and $R_o'$ include straight or branched chain alkyl groups having 1–4 carbon atoms. Preferable examples of $R_1$ to $R_3$ include methyl, ethyl, t-butyl and the like. Preferable examples of R, $R_o$, R' and $R_o'$ include hydrogen atom, methyl group and the like. Preferable examples of the phenol compound represented by general formulas (I) and (II) include the following:

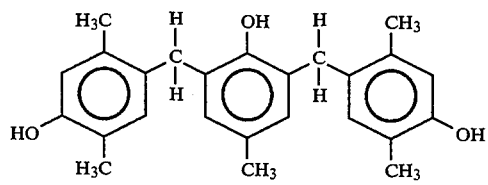
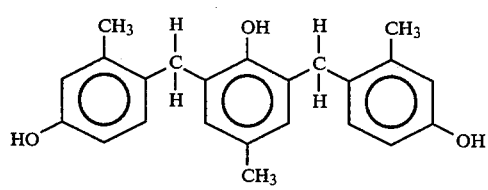
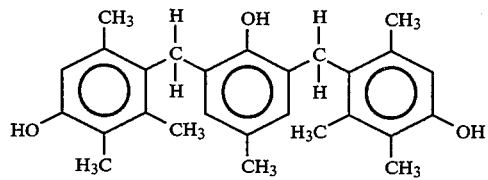
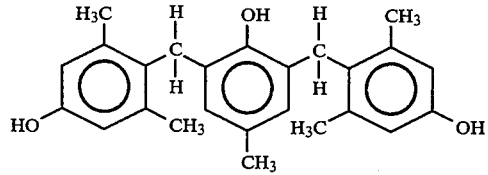
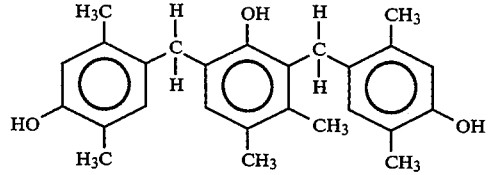
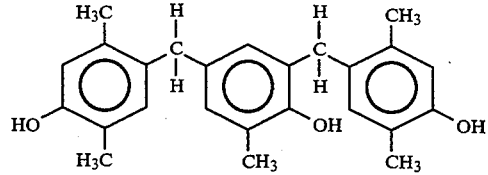
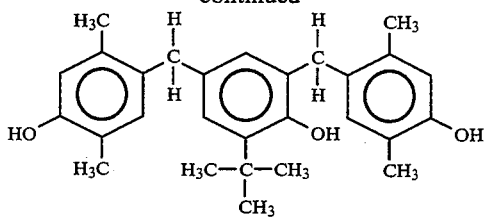
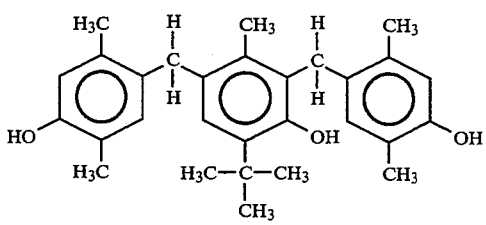
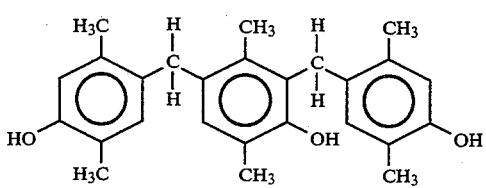

and the like.

The phenol compounds represented by the general formulas (I) and (II) can be produced by, for example, reacting a compound represented by the following formula:

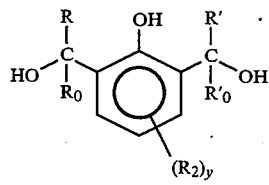

or

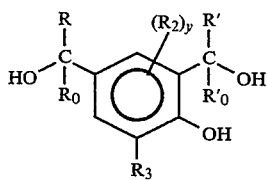

wherein R, $R_o$, R', $R_o'$, $R_2$, $R_3$ and y are as defined above, with a compound represented by the following formula:

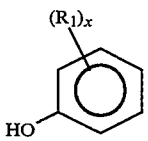

wherein $R_1$ and x are as defined above, in a solvent such as methanol or the like in the presence of an acid catalyst such as p-toluenesulfonic acid, sulfuric acid or the like.

The ratio of the quantity of the quinonediazidesulfonic acid diester of the phenol compound represented by formula (I) or (II) to the total quantity of the light-sensitive quinonediazide material is 0.5/1 or greater as expressed in terms of pattern area ratio measured by high speed liquid chromatography using 254 nm ultraviolet ray detector, and a greater value of the pattern area ratio gives a positive resist having more excellent properties such as high resolution and high γ value. For example, if the quantity of quinonediazidesulfonic acid triester of the phenol compound represented by formula (I) or (II) increases, the result is not good because scum increases even though film thickness retention improves. If the quantity of the quinonediazidesulfonic acid monoester of the phenol compound represented by formula (I) or (II) increases, no good result is obtained from the viewpoint of film thickness retention and scum.

As the light-sensitive quinonediazide material, quinonediazidesulfonic acid esters of the phenol compounds represented by general formulas (I) and (II) are preferable. When said esters are used, the result becomes better with regard to resolution and depth of focus as the proportion of the quinonediazidesulfonic acid diester in which the hydroxyl groups attached to the two terminal benzene rings, among the three benzene rings in the total, are both esterified increases. The ratio of the quantity of said diester to the total quantity of the quinonediazidesulfonic acid esters of the phenol compound represented by formula (I) or (II) is preferably 0.4/1 or greater, as expressed in terms of pattern area ratio measured by high speed liquid chromatography using 254 nm ultraviolet ray detector.

The quinonediazidesulfonic acid esters of the phenol compounds represented by general formulas (I) and (II) can be produced by reacting a phenol compound represented by general formula (I) or (II) with 1,2-naphthoquinonediazidesulfonyl halide or 1,2-benzoquinonediazidesulfonyl halide in the presence of a weak alkali. By appropriately selecting the reaction conditions such as molar ratio between the phenol compound and the halide, etc., quinonediazidesulfonic acid diester of the phenol compound of formula (I) or (II) can be obtained in a high selectivity.

The light-sensitive quinonediazide material is used usually in an amount of 5–50% by weight, preferably in an amount of 10–40% by weight, based on the total solid component in the positive resist composition.

The alkali-soluble resin is obtainable through an addition-condensation reaction of a phenol compound with an aldehyde compound. Examples of said phenol compound include one member or mixtures of two or more members selected from phenol, o-, m- and p-cresols, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene, 1,5-dihydroxynaphthalane, one or more phenol compounds represented by the following general formula (III):

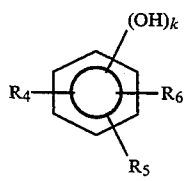

wherein $R_4$ to $R_6$ independently of one another each represent hydrogen atom or alkyl or alkoxy group having 1–4 carbon atoms and k represents 1 or 2, one member or mixtures of two or more members selected from the compounds represented by the following general formula (IV):

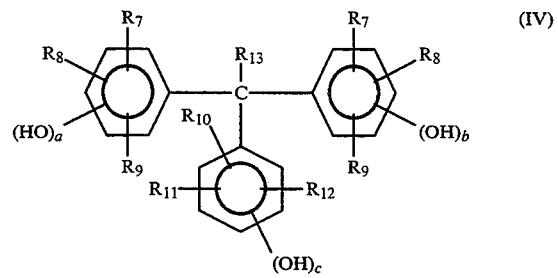

wherein $R_7$ to $R_{12}$ independently of one another each represent hydrogen atom or alkyl or alkoxy group having 1–4 carbon atoms, $R_{13}$ represents hydrogen atom, alkyl group having 1–4 carbon atoms or aryl group, and a, b and c each represent 0, 1 or 2, provided that $a+b+c>2$, and the like. These phenol compounds are used either singly or in the form of a mixture of two or more members.

Examples of the aldehyde compound include formaldehyde, paraformaldehyde, acetaldehyde, propyl aldehyde, benzaldehyde, phenyl aldehyde, α- and β-phenylpropyl aldehydes, o-, m- and p-hydroxybenzaldehydes, glutaraldehyde, glyoxal, o- and p-methylbenzaldehydes, and the like.

The addition-condensation reaction between a phenol compound and an aldehyde compound is carried out in the usual manner in the presence of an acid catalyst. As for the reaction conditions, the temperature is usually 60°–250° C. and the reaction time is usually 2–30 hours. Examples of the acid catalyst include organic acids such as oxalic acid, formic acid, trichloroacetic acid, p-toluenesulfonic acid and the like, inorganic acids such as hydrochloric acid, sulfuric acid, perchloric acid, phosphoric acid and the like, and divalent metal salts such as zinc acetate, magnesium acetate and the like. The addition-condensation reaction is carried out in a bulk phase or in an appropriate solvent. The alkali-soluble resin formed by the addition-condensation reaction preferably has a polystyrene-converted weight average molecular weight of 2,000–50,000.

In view of the resolution and the scum, the alkali-soluble resin obtained by the addition-condensation reaction is treated by, for example, fractionation, so that an area in a GPC pattern (using a UV-detector of 254 nm; hereinafter the same) of a range in which a polystyrene-converted molecular weight of 1,000 or less does not exceed preferably 25%, more preferably 20%, particularly preferably 15% of the whole pattern area excluding the unreacted phenol compound.

The fractionation is carried out by a method which comprises dissolving the alkali-soluble resin formed by the addition-condensation reaction in a good solvent such as alcohols (methanol, ethanol and the like), ketones (acetone, methyl ethyl ketone, methyl isobutyl ketone and the like), ethylene glycol or its ethers, ether-esters (ethyl cellosolve acetate and the like), tetrahydrofuran and the like, and pouring a resulting solution in water to precipitate the resin, or by pouring the solution in a solvent such as pentane, hexane, heptane or cyclohexane to separate it. After the fractionation, the alkali-soluble resin preferably has a weight average molecular weight of 3,000–20,000.

The alkali-soluble resin is used in an amount of 50–95%, preferably, 60–90% by weight based on the total solid component in the positive resist composition. If necessary, the positive resist composition may contain various additives such as sensitizer, a compound represented by the above-mentioned general formula (IV), other resin, surfactant, stabilizer, dye for making the formed image more visible, and the like.

A solvent in which the components are dissolved is preferably one that evaporates at an appropriate drying rate to give a uniform and smooth coating film. Examples of such solvent include glycolether-esters such as ethylcellosolve acetate, propyleneglycol monomethylether acetate and the like; the solvents mentioned in Japanese Patent Application KOKAI No. 2-220056; esters such as ethyl pyruvate, n-amyl acetate, ethyl lactate and the like; and ketones such as 2-heptanone, γ-butyrolactone and the like. These solvents are used either singly or in the form of a mixture of two or more members.

An amount of the solvent is not particularly critical, so far as the composition can form a uniform film on a wafer without pinholes and coating irregularity. Usually, the amount of the solvent is adjusted so that the content of solid component, including light-sensitive quinonediazide material, alkali-soluble resin and various additives, is from 3 to 50% by weight.

PREFERRED EMBODIMENTS OF THE INVENTION

The present invention will be explained by following examples which do not intend to limit the scope of the present invention. In examples, "parts" are by weight.

Synthesis Example 1

Into a mixture of 6.96 g of a compound represented by the following formula:

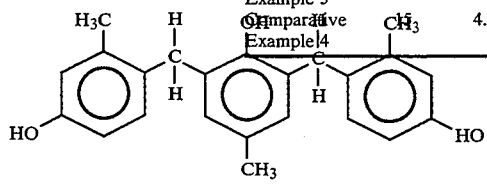

10.75 g of naphthoquinone-(1,2)-diazide-(2)-5-sulfonyl chloride (a molar ratio of 2:1) and 168 g of dioxane was dropwise added 4.45 g of triethylamine at 20°–25° C. over a period of 30 minutes. After the dropping, the resulting mixture was stirred at the same temperature as above for an additional 4 hours. The reaction mixture thus obtained was poured into deionized water, and the resulting crystalline product was collected by filtration, washed with deionized water and dried to obtain light-sensitive quinonediazide material A.

Examples 1–3

Comparative Examples 1–4

An alkali-soluble resin (referred to as "Resin" in table), a light-sensitive quinonediazide material (referred to as "Sensitizer" in table) and additive were mixed together with 2-heptanone (50 parts) in amounts shown in Table 1, and filtrated through a polytetrafluoroethylene filter having a pore size of 0.2 μm to obtain a resist solution.

Using a spinner, the resist solution was coated on a silicon wafer which had been rinsed in a usual way to form a resist of 1.1 μm in thickness. Subsequently, the silicon wafer was baked on a hot plate at 90° C. for one minute, and was exposed to light having a wavelength of 365 nm (i line) while varying the exposure time stepwise by means of a reduction projection exposing apparatus (manufactured by Nicon Co., NSR1755i7A with NA=0.5). Then, the wafer was baked on a hot plate at 110° C. for one minute and was developed with SOPD (developing solution, a product of Sumitomo Chemical Co., Ltd.) for one minute to obtain a positive pattern.

Resolution was evaluated by observing, with a scanning electron microscope, a width of a line-and-space pattern which was separated without film thickness decrease at an exposure amount (effective sensitivity) at which a 0.5 μm line-and-space pattern was 1:1.

Profile was evaluated by observing the cross-sectional shape of 0.5 μm line-and-space pattern at the effective sensitivity with a scanning electron microscope.

A depth of focus was determined by measuring, with a scanning electron microscope, a degree of focus shifting at which the 0.4 μm line-and-space pattern could be resolved at an effective sensitivity without film thickness decrease.

The results obtained are shown in Table 1.

TABLE 1

| Example No. | Composition of resist | | | | Properties of resist | | | | |
|---|---|---|---|---|---|---|---|---|---|
| | Resin (parts) | Additive (parts) | Sensitizer (parts) | | Effective sensitivity (msec) | Resolution (μm) | Profile | Depth of focus (μm) | Scum |
| Example 1 | 15 | 4.5 | A | 4.5 | 500 | 0.35 | | 1.5 | Unnoticeable |
| Example 2 | 15 | 4.5 | B | 4.5 | 520 | 0.35 | | 1.5 | Unnoticeable |
| Example 3 | 15 | 4.5 | C | 4.5 | 520 | 0.35 | | 1.5 | Unnoticeable |
| Comparative Example 1 | 15 | 4.5 | D | 4.5 | 500 | 0.375 | | 1.0 | Noticeable |
| Comparative Example 2 | 15 | 4.5 | E | 4.5 | 500 | 0.375 | | 0.8 | Unnoticeable |
| Comparative Example 3 | 15 | 4.5 | F | 4.5 | 520 | 0.375 | | 1.0 | Unnoticeable |
| Comparative Example 4 | 15 | 4.5 | G | 4.5 | 480 | 0.40 | | 0.5 | Noticeable |

The sensitizer A to G shown in the above-presented table were synthesized by reacting each of the phenol compounds A' to G' shown below with naphtho-quinone-(1,2)-diazide-(2)-5-sulfonyl chloride in the same manner as in Synthesis Example 1. In the reaction, a molar ratio of reactants, i.e. phenol compound/naphthoquinone-(1,2)-diazide-(2)-5-sulfonyl chloride, was 1:2.0 throughout all the cases.

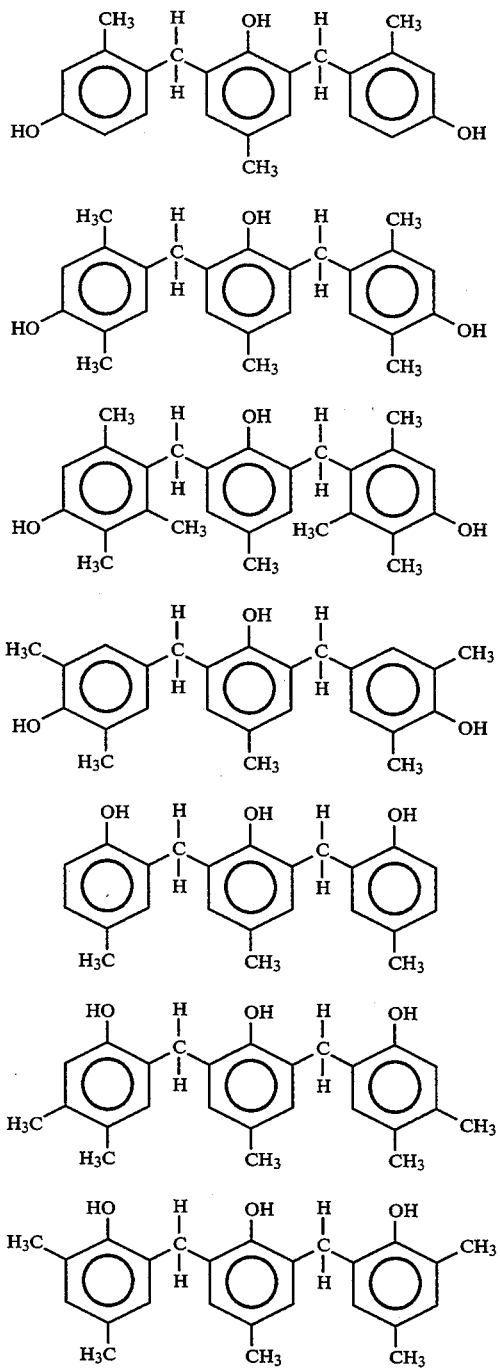

A'

B'

C'

D'

E'

F'

G'

Resin: A novolak resin was obtained through an addition-condensation reaction of phenol compounds with formaldehyde (a molar ratio of m-cresol/p-cresol/2,5-xylenol was 60/10/30, a molar ratio of phenol compounds/formaldehyde was 1/0.86), under reflux, by using oxalic acid. In the GPC pattern of this novolak resin, the ratio of the pattern area of a component having a molecular weight of 6,000 or lower was 34% and the ratio of the pattern area of a component having a molecular weight of 1,000 or lower was 15%, both based on the total pattern area from which the pattern area of unreacted phenol compounds was excepted. The novolak resin had a weight average molecular weight of 8,000. (All the molecular weights referred to herein are polystyrene-converted molecular weights.) The novolak resin was used as an alkali-soluble resin.

Additive: A compound represented by the following formula:

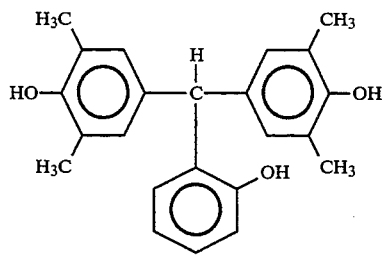

was used as an additive.

Table 2 illustrates results of measurements by high speed liquid chromatography, wherein the term "diester ratio" signifies the ratio of pattern area of the quinonediazidesulfonic acid diester to the pattern area of total quinonediazidesulfonic acid esters (total light-sensitive quinonediazide material); the term "terminal diester ratio" signifies the ratio of pattern area of the quinonediazidesulfonic acid diester in which the two hydroxyl groups attached to the two terminal benzene rings, among the three benzene rings, are both esterified to the pattern area of the total quinonediazidesulfonic acid esters; and the term "triester ratio" signifies the ratio of pattern area of the quinonediazidesulfonic acid triester to the pattern area of the total light-sensitive quinonediazide material.

TABLE 2

| Example No. | Diester ratio | Terminal diester ratio | Triester ratio |
|---|---|---|---|
| Example 1 | 0.87/1 | 0.87/1 | 0.09/1 |
| Example 2 | 0.76/1 | 0.76/1 | 0.19/1 |
| Example 3 | 0.88/1 | 0.88/1 | 0.08/1 |
| Comparative Example 1 | 0.43/1 | 0.30/1 | 0.44/1 |
| Comparative Example 2 | 0.85/1 | 0.85/1 | 0.08/1 |
| Comparative Example 3 | 0.84/1 | 0.84/1 | 0.08/1 |
| Comparative Example 4 | 0.62/1 | 0.23/1 | 0.27/1 |

What is claimed is:

1. A positive resist composition comprising an alkali-soluble resin and, as a sensitizer, a mixture of quinonediazidesulfonic acid esters of a phenol compound represented by the following formula:

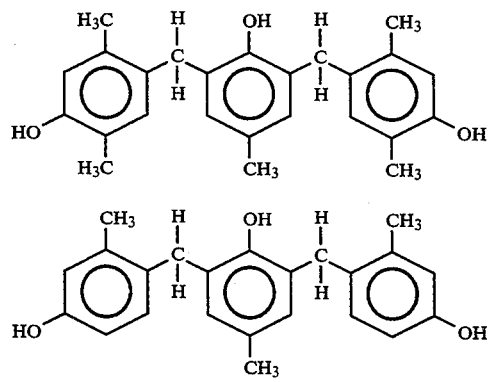

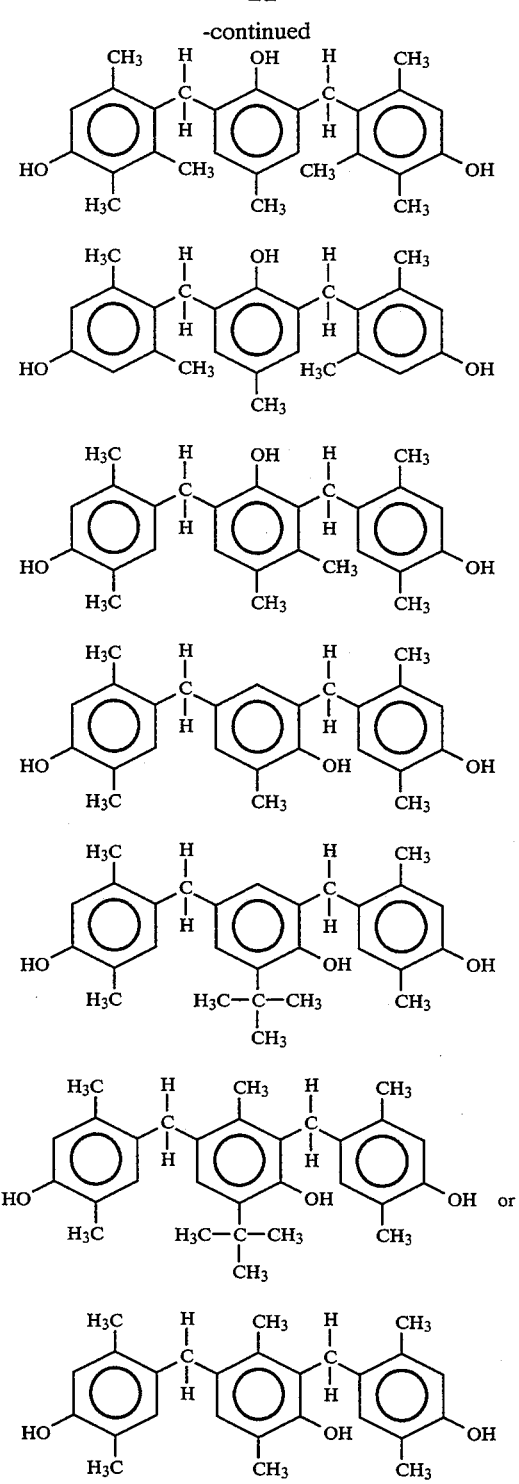

provided that said mixture of quinonediazidesulfonic acid esters of the phenol compound contains a quinonediazidesulfonic acid diester in such a proportion that in a high speed liquid chromatograph spectrum of the sensitizer measured with a detector using UV light with a wavelength of 254 nm, the pattern area corresponding to the diester is not less than 50% of the total pattern areas corresponding to the sensitizer, said quinonediazidesulfonic acid diester being an ester of said phenol compound in which the hydroxyl groups attached to the two terminal benzene rings of the phenol compound, among the three benzene rings in total, are both esterified with a quinonediazidesulfonic acid.

2. A positive resist composition according to claim 1, wherein the alkali-soluble resin is obtainable through an addition-condensation reaction of at least one phenol compound selected from the group consisting of phenol, o-, m- and p-cresols, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene and 1,5-dihydroxynaphthalene, with an aldehyde compound selected from the group consisting of formaldehyde, paraformaldehyde, acetaldehyde, propyl aldehyde, benzaldehyde, phenyl aldehyde, α- and β-phenylpropyl aldehydes, o-, m- and p-hydroxybenzaldehydes, glutaraldehyde, glyoxal and o- or p-methylbenzaldehyde.

3. A positive resist composition according to claim 2, wherein the addition-condensation reaction is carried out in the presence of an acid catalyst at 60° to 250° C. for 2–30 hours.

4. A positive resist composition according to claim 2, wherein said alkali-soluble resin has a polystyrene converted weight average molecular weight of 2,000–50,000.

5. A positive resist composition according to claim 1, wherein the alkali-soluble resin is used in an amount of 50–95% by weight based on the total solid component in the positive resist composition.

6. A positive resist composition according to claim 1, where the sensitizer is used in an amount of 5–50% by weight based on the total solid component in the positive resist composition.

7. A positive resist composition according to claim 1, where the sensitizer is used in an amount of 10–40% by weight based on the total solid component in the positive resist composition.

8. A positive resist composition according to claim 1, wherein the alkali-soluble resin is used in an amount of 60–90% by weight based on the total solid component in the positive resist composition.

9. A positive resist composition according to claim 1, wherein said phenol compound is of the formula

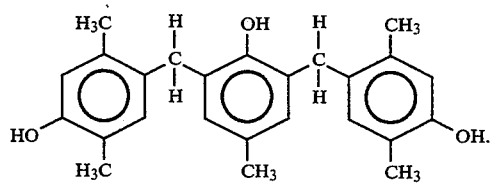

10. A positive resist composition according to claim 1, wherein said phenol compound is of the formula

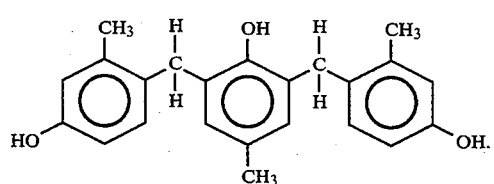

11. A positive resist composition according to claim 1, wherein said phenol compound is of the formula

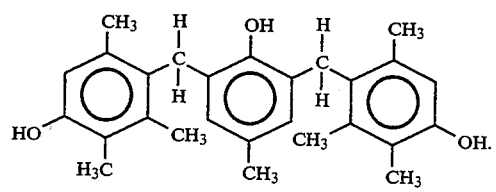
* * * * *